United States Patent [19]

Hamada

[11] Patent Number: 5,748,392
[45] Date of Patent: May 5, 1998

[54] OPTICAL VOLTAGE SENSOR, GROUP OF OPTICAL PARTS AND METHOD OF MANUFACTURING SAME

[75] Inventor: Hidenobu Hamada, Amagasaki, Japan

[73] Assignee: Matsushita Electric Industrial Co., Ltd., Osaka, Japan

[21] Appl. No.: 753,495

[22] Filed: Nov. 26, 1996

[30] Foreign Application Priority Data

Nov. 27, 1995 [JP] Japan .................................. 7-307022

[51] Int. Cl.⁶ .................................................. G02B 7/02
[52] U.S. Cl. .................................................. 359/819
[58] Field of Search ...................... 359/820, 811, 359/819, 831, 832, 507, 512; 385/77, 78, 79, 84, 85, 88, 89

[56] References Cited

U.S. PATENT DOCUMENTS

| | | | |
|---|---|---|---|
| 4,544,231 | 10/1985 | Peterson | 385/85 |
| 4,786,135 | 11/1988 | Boero | 385/79 |
| 4,805,993 | 2/1989 | Blumentritt et al. | 359/820 |
| 4,822,129 | 4/1989 | Webb | 385/79 |
| 4,886,342 | 12/1989 | Kudo et al. | 359/819 |
| 4,890,905 | 1/1990 | Van Rosmalen et al. | 359/819 |

FOREIGN PATENT DOCUMENTS 517086  10/1955  Canada .................................. 359/820

*Primary Examiner*—David C. Nelms
*Assistant Examiner*—Ricky Mack
*Attorney, Agent, or Firm*—Beveridge, Degrandi, Weilacher & Young, LLP

[57] ABSTRACT

A group of thermal change resistant optical parts has:
  at least one intermediate optical part (25,26); and
  two optical parts (27,28) which are positioned on the same optical axis as that of said intermediate optical part and are arranged on a light incoming side and a light outgoing side of the intermediate optical part, respectively, wherein
  the two optical parts (27,28) are integrated into one by cure of an inorganic adhesive (11), thereby the intermediate optical part is sandwiched by the optical parts (27,28) of both sides thereof, and is fixed to the optical parts (27,28) of both sides thereof by friction which is generated in a not-bonded contact faces of the optical parts (27,28) of both sides.

15 Claims, 6 Drawing Sheets

FIG. 3
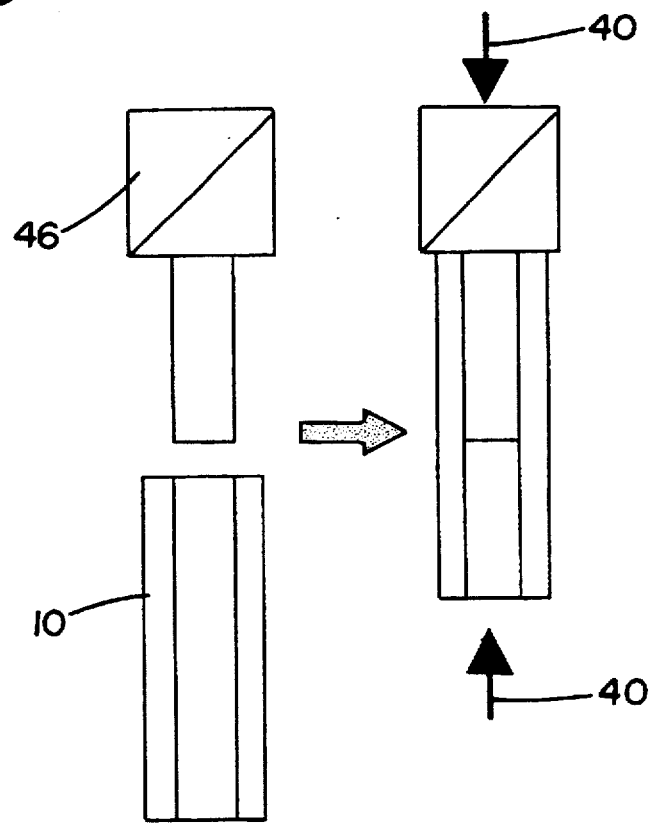
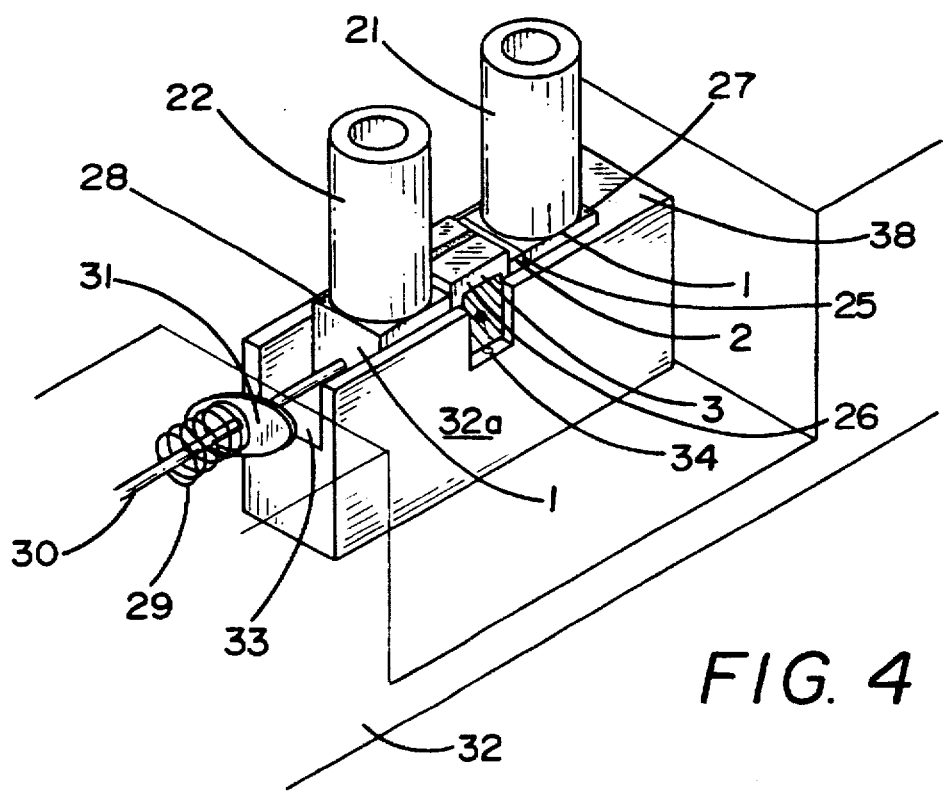
FIG. 4

5,748,392

1

OPTICAL VOLTAGE SENSOR, GROUP OF OPTICAL PARTS AND METHOD OF MANUFACTURING SAME

BACKGROUND OF THE INVENTION

1. Field of the Invention

The invention relates to a group of optical parts such as optical voltage sensors which are used for detecting a voltage of a power transmission line or a distribution line, or a voltage of a power source for driving a motor etc.

2. Related Art of the Invention

An optical voltage sensor, as shown in FIG. 7, comprises a sensor 24, an input side optical system 21, an output side optical system 22, and a lightwave signal processor (not shown). In this sensor 24 are arranged a right angle PBS (polarizer) 1, a quarter wavelength plate 4, a Pockels element 3, a right angle PBS (analyzer) 1 in order of light incidence on an optical axis, and the optical axis faces of these optical parts, which contact each other, are all bonded by an adhesive. To the Pockels element 3 are electrically connected an electrode terminal 14, a lead wire 13 and an electrode 5 for the purpose of applying a voltage, and an object voltage 24 is applied to the electrode terminal 14. A lightwave signal processor and the sensor 24 are connected by an input side optical system 21 and an output side optical system 22, and the optical axis planes of the sensor 24 on the input and the output side are fixed to the optical axis planes of the sensor sides of the input side and output side optical systems 21 and 22, respectively, by an adhesive. Additionally the input side optical system 21 comprises an optical fiber 6, a ferrule 8 and a lens 9 on the optical axis (input side), and the optical axis planes of the respective optical parts are bonded by an adhesive, while the output side optical system 22 is constructed in the same manner as with the input side optical system 21. The optical axis planes described herein means planes perpendicular to the respective optical axes, namely, there are two planes where light comes in and goes out. The sensor 24, the input side optical system 21 and the output side optical system 22 which are fixed and bonded, are fixed to a lower case 23. As the adhesive for the optical parts is used an optical resin selected from among epoxy resins or urethane base resins.

Additionally, as the Pockels element 3 is used a crystal selected from among $Bi_{12}SiO_{20}$(BSO), KDP, $LiNbO_3$ and $LiTaO_3$ having birefringence property, and the like.

Next the principle of the optical voltage sensor will be described. When as a light source of the (input side) optical fiber 6 is used, for example, a LED having a center wavelength of 0.88 μm, not-polarized of the LED becomes linearly polarized light after having passed through a right angle PBS (polarizer) 1 of the sensor 24. The linearly polarized light becomes circularly polarized light after having passed through a λ/4 plate 4, and the circularly polarized light becomes oval according to the applied voltage 24 of the Pockels element 3 after having passed through the Pockels element. Since the changes of output strength of the ovally polarized light after having passed through the right angle PBS 1 (analyzer) correspond to the polarization state of the light passed through the Pockels element 3 which is changed by the application voltage 24, the applied voltage 24 can be measured by monitoring the changes of output strength of the right angle PBS (analyzer) 1 via a (output side) optical fiber 7 in an optical receiver and calculating modulation depth of light power (strength). The modulation depth of light power described herein indicates a ratio of AC component to DC component of light power.

2

By the way, since the optical voltage sensor is usually used outdoors under severe conditions, a high performance in temperature dependence is required, more specifically, a change in modulation depth of ±1% or less is preferable at a temperature within a range of −20° to 80° C. With respect to the temperature dependence, the λ/4 plate 4 and the Pockels element 3 show changes in natural birefringence and the Pockels effect due to stress of the bonded portions, and even when Z-axis of $LiNbO_3$ or the like is used as the optical axis, the temperature dependence of natural birefringence appears due to axial displacement of the incident light.

The change in birefringence in the λ/4 plate due to stress can be overcome by using a zero-order single plate as the λ/4 plate 4. However, the zero-order single plate is expensive, and improvement of a low cost multilayer film zero-order λ/4 plate 2 is desired. With respect to the appearance of the natural birefringence due to the axial displacement of light, the axial displacement angle can be reduced to 0.2° or less by keeping a plane-making accuracy on the optical axis plane of the optical parts 30 minutes or less, and thereby the problem in temperature dependence due to the axial displacement can be also overcome.

However, with respect to the problem of the stress applied to the Pockels element 3, there is no proper means for overcoming the problem at present, and the temperature dependence of a prior art optical voltage sensor is, as shown in FIG. 8, about 10% at the maximum. Besides, since the stress changes depending on an environment during manufacture of optical voltage sensors, the appearance of temperature dependence has no reproducibility, and therefore it is difficult to control the temperature dependence.

Japanese Unexamined Patent Publication JP-A 4-291165 discloses a method of manufacturing an optical application sensor. The manufacturing method is such that after optical axes of plural optical parts composing the optical application sensor are adjusted by a substrate for adjusting optical axes, the respective optical parts are bonded by a synthetic resin such as epoxy resins and urethane base resin s so that they contact each other with no gap therebetween, and the contacted optical parts and the periphery of an optical fiber or the like are molded by the same resin without forming a gap and a void. This manufacturing method is effective to a photo electric sensor, but in the case of an optical voltage sensor, wherein changes in characteristics due to stress or axial displacement appear, undesired temperature dependence is caused by the occurrence of axial displacement due to deformation of the synthetic resin caused by a change in temperature and the occurrence of stress caused by a difference between the synthetic resin and the Pockels element.

In the prior art method, since it is impossible to control the stress applied to the Pockels element and the zero-order multilayer film λ/4 plate by bonding, not only the temperature dependence is undesirable, but also temperature dependences are uneven among each optical voltage sensor. Therefore accurate measurement of voltage is impossible and from an aspect of controlling temperature dependence, it is necessary to evaluate all the optical voltage sensors, which results in higher cost.

SUMMARY OF THE INVENTION

Hence in consideration of the problems of the prior art, an object of the invention is to provide an optical voltage sensor having a good temperature dependence with respect to sensitivity and light quantity, and provide a method of manufacturing the same with ease and low cost.

A group of thermal change resistant optical parts of the present invention comprises:

at least one intermediate optical part (25,26); and two optical parts (27,28) which are positioned on the same optical axis as that of said intermediate optical part and are arranged on a light incoming side and a light outgoing side of the intermediate optical part, respectively, wherein the two optical parts (27,28) are integrated into one by cure of an inorganic adhesive (11), thereby the intermediate optical part is sandwiched by the optical parts (27,28) of both sides thereof, and is fixed to the optical parts (27,28) of both sides thereof by friction which is generated in a not-bonded contact faces of the optical parts (27,28) of both sides.

According to an optical voltage sensor of the invention, the λ/4 plate and the Pockels element have no face bonded with an adhesive and therefore are free of stress caused by difference between their thermal expansion coefficients and that of an adhesive, so that the optical voltage sensor can measure an accurate object voltage without being subject to temperature. Additionally optical parts of low cost can be used, and it is possible to employ an easy assembly method which does not depend on skill of workers with the result that the characteristics can be easily controlled and cost can be reduced.

BRIEF DESCRIPTION OF THE DRAWINGS

FIG. 3 is a schematic view of a method of integrating parts of an embodiment of the invention;

FIG. 4 is a schematic view of a mid-stage of a method of assembling an optical voltage sensor of an embodiment of the invention;

PREFERRED EMBODIMENTS

Figure 1:
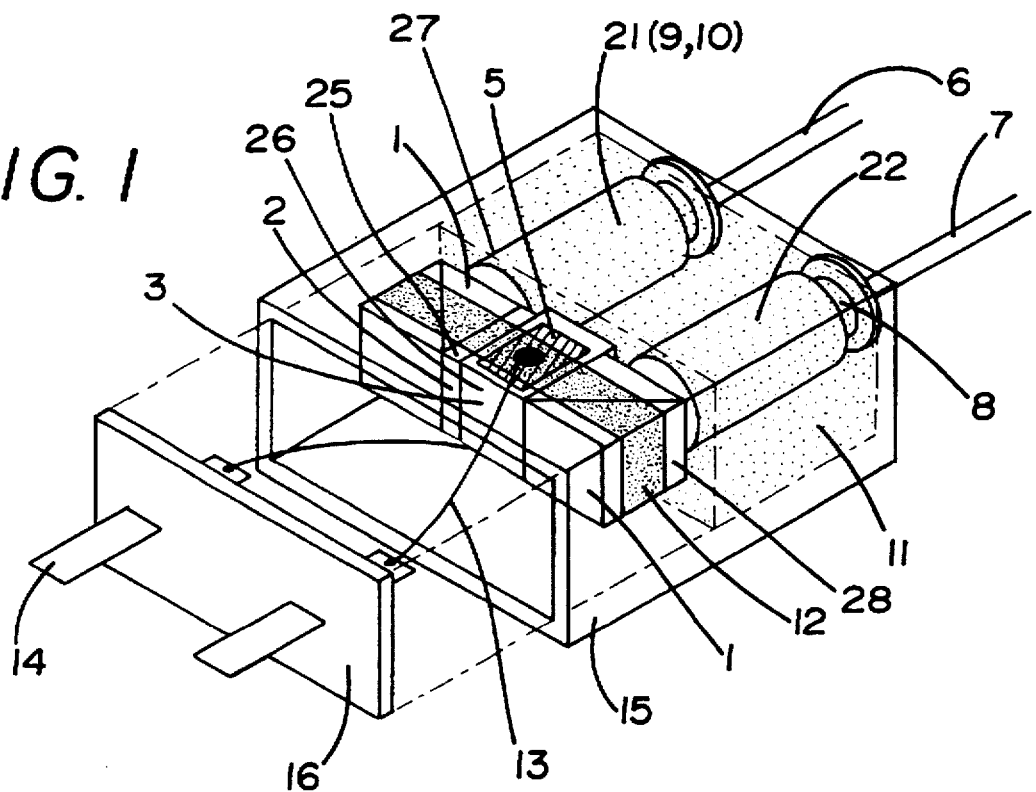
FIG. 1 is a schematic view of an optical voltage sensor of an embodiment of the invention.

Referring to drawings, preferred embodiments of the invention will be described. FIG. 1 is a schematic view of a structure of an optical voltage sensor of an embodiment, FIGS. 2 through 5 are schematic views of an assembly, and FIG. 6 is a diagram showing temperature dependences of sensitivity.

Firstly, referring to FIG. 1, an optical voltage sensor of an embodiment of the invention will be described. Contact faces of a GRIN lens 9 and optical parts of a holder 10 are fixed by an optical adhesive to contact each other to form an input side optical system 21 and an output side optical system 22, and then right-angle PBSs 1 are bonded to the optical systems to form a third optical part 27 and a fourth optical part 28, respectively.

Furthermore, as part of an assembly constituting a sensor 20, composed of optical parts, a first optical part 25 is composed of a multilayer film zero-order λ/4 plate 2 whose characteristics are changed by external stress, and a second optical part 26 is composed of a Pockels element 3 whose characteristics are also changed by external stress. Then, as shown in FIG. 1, the third optical part, the first optical part, the second optical part, the fourth optical part are arranged on the same optical axis in this order from a light incoming side, and a bolder of the third optical part 27 and a fourth optical part 28 are integrated into one body by curing a ceramic based adhesive having a coefficient of thermal expansion of $20 \times 10^{-6}/°C$. or less after curing. Accordingly, the multilayer film zero-order λ/4 plate 2 and the Pockels element 3 are inserted on the same optical axis between the holder of the third optical part 27 and the fourth optical part 28 with a proper force. As a consequence, three combinations of contact faces between the light outgoing side face of the third optical part 27 and the light incoming side face of the multilayer film zero-order λ/4 plate 2, between the light outgoing side face of the third optical part 27 and the light incoming face of the multilayer film zero-order λ/4 plate 2, and between the light outgoing face of the Pockels element 3 and the light incoming face of the fourth optical part 28 are in a not-bonded state, and thereby the multilayer film zero-order λ/4 plate and the Pockels element 3 are fixed and held between the third optical part 27 and the fourth optical part 28 with friction generated in the not-bonded contact faces. These parts are cased in cases 15, 16 to which electrode processing was applied. That is, the parts are accommodated by the side case 15, and covered by the upper case 16. A voltage terminal 14 is mounted in the upper case 16, and connected to an electrode 5 mounted on the Pockels element 3 via a lead wire 13. Furthermore each of the input side optical system 21 and the output side optical system 22 is equipped with an optical fiber for input 6 with a ferule 8 and an optical fiber for output with another ferule 8.

Since the optical axis is bent by the right-angle PBSs of the third optical part 27 and the fourth optical part 28 so as to form a right-angle, the optical axes of the input side optical system 21 and the output side optical system 22 are parallel to each other, and additionally since the axis common to the multilayer film λ/4 plate 2 and the Pockels element 3 is orthogonal to the optical axis of the input side optical system 21, a U-shape is formed by these optical axes.

Furthermore, as shown in FIG. 1, along faces excluding the not-bonded contact faces of the right-angle PBS 1, the multilayer zero-order λ/4 plate 2 and the Pockels element 3, thermally contractive tube 12 or a band-shaped loop rubber is provided so as to bundle the multilayer film λ/4 plate 2, the Pockels element 3, and the right-angle PBSs 1 of the third optical part 27 and the fourth optical part 28. Thereby the fixing and holding of the multilayer film zero-order λ/4 plate 2 and the Pockels element 3 can be enhanced. Additionally, in the case where there is fear of formation of an air layer between the not-bonded contact faces at the three locations due to the optical parts surface defects or the like, it is not problematic that the gaps are filled with a silicone compound (optical grease) in order to restrain the reflection caused by different refractive indices of the air and the optical parts.

Next, referring to FIGS. 2 through 5, a method of assembling an optical voltage sensor of an embodiment will be described.

Figure 2:
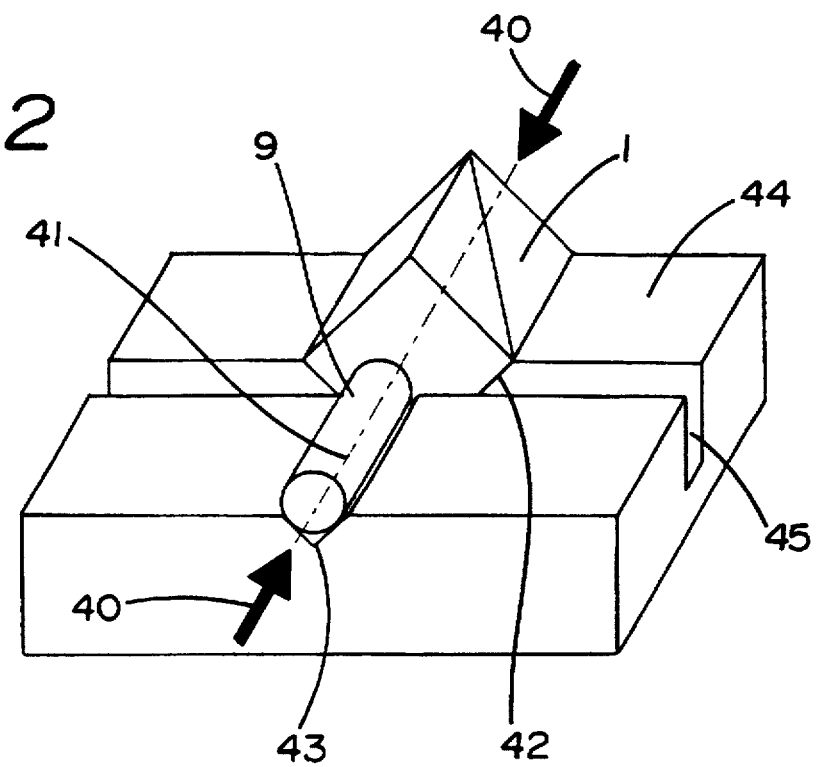
FIG. 2 is a schematic view of a method of assembling a right-angle PBS and a lens of an embodiment of the invention.

Firstly, a method of assembling the third optical part 27 and the fourth optical part 28 will be described. As shown in FIG. 2, the optical axes 41 of the right-angle PBS 1 and the GRIN lens 9 are aligned by using a V-groove one-body jig 44 in which a V-groove 42 for the right-angle PBS and a V-groove 43 for the GRIN lens are integrated.

In this state, after an optical adhesive is applied to one face of each combination of contact faces, the optical adhesive is cured under the condition that force 40 is applied to the optical axis of the right-angle PBS 1 and the GRIN lens 9 from both sides. A reference numeral 45 represents a clearance groove for the adhesive. An integrated unit 46 composed of the right-angle PBS 1 and the GRIN lens 9 is thus manufactured. If at this time, there is a runout of the adhesive into the contact of the right-angle PBS and the GRIN lens, the runout causes bad contact of the holder 10 to be integrated later. Therefore, when the integrated unit 46 is completed, the adhesive run out is removed.

Next, as shown in FIG. 3, the GRIN lens 9 is inserted into the holder 10 and the optical adhesive is applied to the edge of the holder 10. Thereafter, while force having a proper resiliency is applied to the optical axis from both sides of the holder 10 and the integrated unit 46, the optical adhesive is cured. The right-angle PBS 1, the GRIN lens 9 and the holder 10 are thus integrated into one to make the third optical part 27 and the fourth optical part 28.

An inner diameter of the holder 10 is, when the outer diameters of the GRIN lens 9 and the ferule 8 are equal to each other, equal to the outer diameter. However, when the outer diameters are not equal to each other, the holder 10 is designed so that an inner diameter of a portion of the holder 10 where the GRIN lens 9 exists is equal to the outer diameter of the GRIN lens 9; that an inner diameter of a portion of the holder 10 where the ferule 8 exists is equal to the outer diameter of the ferule 8; and that the center axes of the inner diameter of the portions of the holder 10 coincide. Since the optical axes of the GRIN lens 9 and the ferule 8 are thus adjusted by utilizing the inner diameters of the holder 10 and the position of the center axis of the inner diameters, highly accurate inner diameters of the holder 10 and a highly accurate position of the center axis of the inner diameters are required.

Any material can be used as the optical adhesive if the material is optically transparent, however, an epoxy resin is used in the embodiment.

Next, as shown in FIG. 4, a block 32 having a big notch 32a at the center thereof is prepared. A guiding member 33 having a groove-shaped guide 33a for adjusting the optical axis is formed at a central portion of the notch 32a. Referring to FIG. 4, the front of the groove-shaped guide 33a is open, and the back thereof is closed. A relief hole 34 is provided on a side wall of the block member 33.

In the groove-shaped guide 33a are arranged the right-angle PBS 1 of the third optical part 27, the multilayer film zero-order λ/4 plate 2, the Pockels element 3 and the right-angle PBS 1 of the fourth optical part 28 so that the holder 10 of the third optical part 27 and the holder 10 of the fourth optical part 28 stand upward. At a position where the optical axes coincide with each other, a part presser bar 30 which is supported via a spring 29 and a flange 31 by an inner wall of the notch 32a of the block 32, is pushed to the right-angle PBS 1 of the fourth optical part 28 of the output side optical system 22.

Thereby the right-angle PBS 1 of the third optical part 27 of the input side optical system 22 is pressed to a block wall 38 of the back side of the groove-shaped 33a which is on the opposite side to the part presser bar 30.

As a result, external force having a proper resilience is applied to the outsides of the right-angle PBS 1 of each of the third optical part 27 and the fourth optical part 28 in the parallel direction to the optical axis of the multilayer film zero-order λ/4 plate and the Pockels element 3, and thereby the third optical part 27, the multilayer film zero-order λ/4 plate 2, the Pockels element 3 and the fourth optical part 28 are temporarily fixed.

Figure 5:
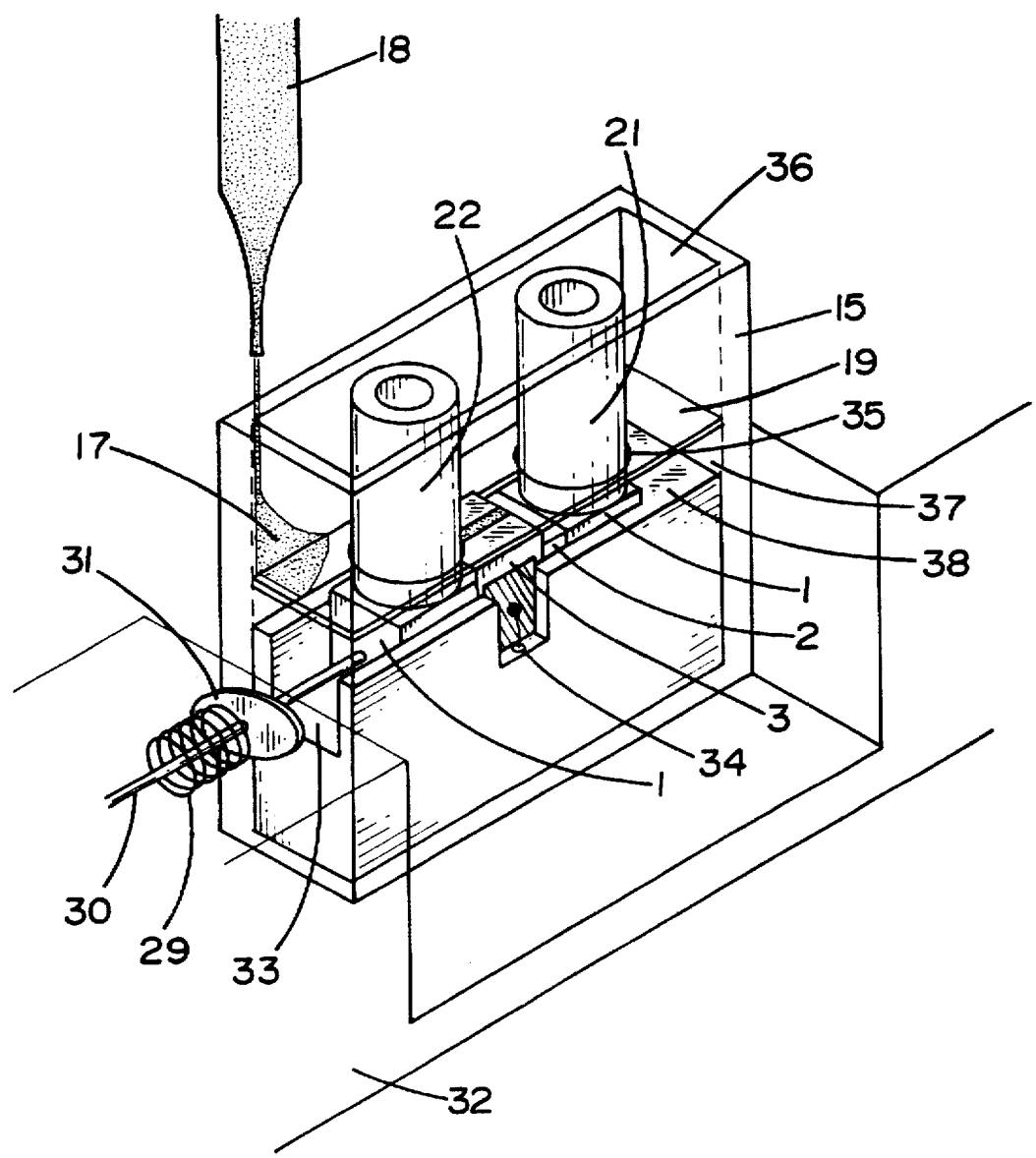
FIG. 5 is a schematic view of a final stage of a method of assembling an optical voltage sensor of an embodiment of the invention.
Figure 6:
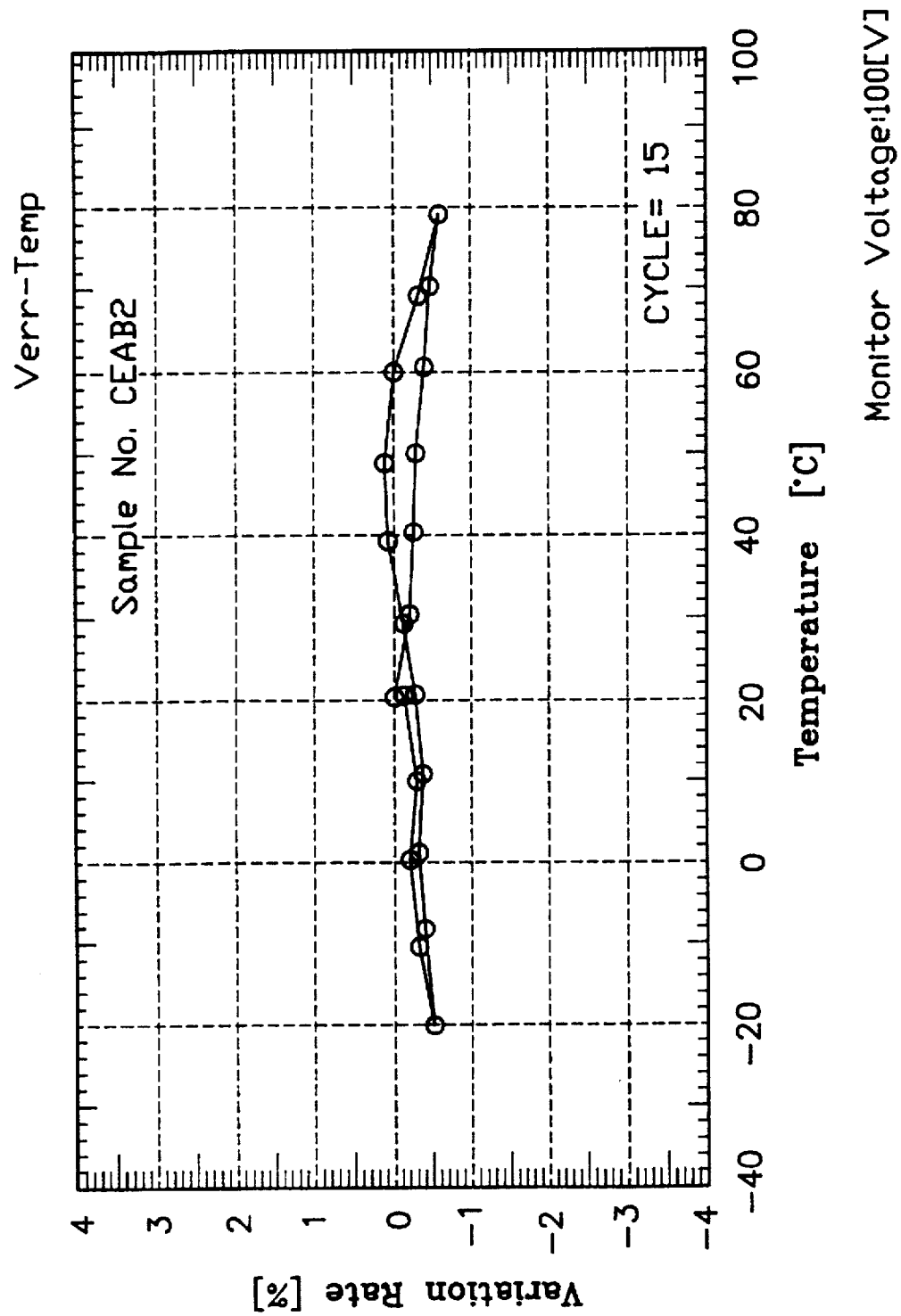
FIG. 6 is a diagram showing temperature dependences of sensitivity of an optical voltage sensor of an embodiment of the invention.
Figure 7:
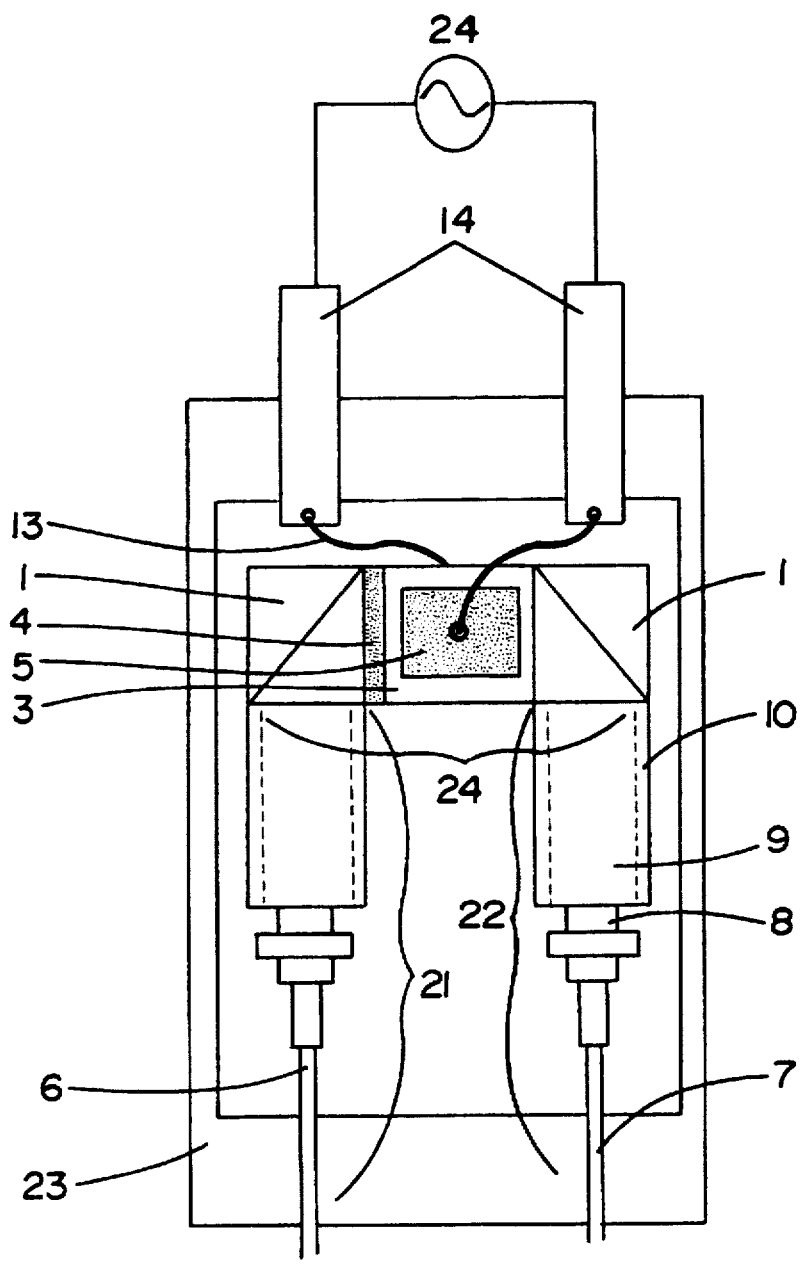
FIG. 7 is a schematic view of a prior art optical voltage sensor.
Figure 8:
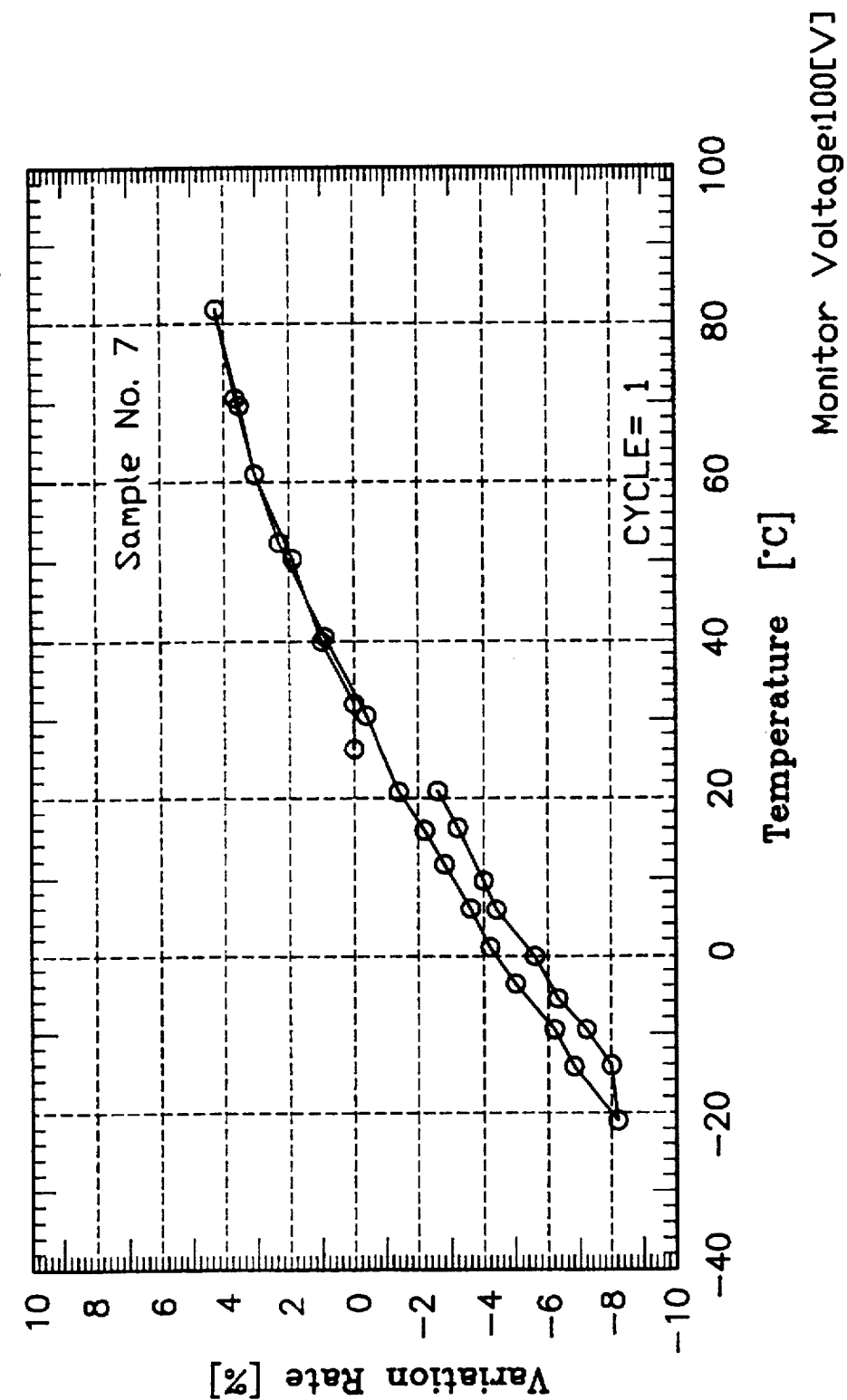
FIG. 8 is a diagram showing temperature dependences of a prior art optical voltage sensor.

Next, as shown in FIG. 5, under the condition of the temporary fixation, an outer case 15 which has the same inner shape and size as those of the guide member 33 is placed on the outside of the guide member 33. A partition plate 19 is provided inside the case 15. The partition plate 19 is provided with two round holes having the same diameter as the outer diameter of the holder 10. The positions of the round holes correspond to the positions of the respective holders 10, 10. The partition plate 19 is attached to the outer case 15 so that the partition plate 19 has been placed at a lower end portion of the holder 10 when the outer case 15 is completely inserted to the lowermost part of the guide member 33. A gap 35 which is formed when the holder 10 is inserted in the round hole of the partition plate 19 is sized so as not to be passed by a ceramic adhesive 17 described in the following.

In this manner, the partition plate 19 parts into an upper space 36 which does not contain the multilayer film zero-order λ/4 plate 2 and the Pockels element 3, and a lower space 37 which contains the multilayer film zero-order λ/4 plate 2 and the Pockels element 3.

Next, the upper space 36 is filled with the ceramic adhesive 17 (before curing) by using a liquid ceramic dispenser 18. After the holder 10 of the third optical part 27 and the holder 10 of the fourth optical part 28 are integrated by curing of the ceramic adhesive 17, the third and fourth optical parts 27, 28 which are integrated, and the multilayer film zero-order λ/4 plate 2 and the Pockels element 3 which are sandwiched between the third and fourth optical parts 27, 28 and held by friction, are released from the groove-shaped guide for adjusting the optical axis and the external force having a resilience.

The strength of the external force having a resilience depends on the spring 29, and is a few hundreds gram in the present embodiment. In the embodiment the spring is used as means for generating the external force having a resilience, however, any means such as rubber or a flat spring may be used if the means generates a resilience. Additionally as the Pockels element 3 is often used a piezoelectric, and the higher the external force having a resilience, the higher the friction is, so that fixation and hold are enhanced. However high friction causes degradation of characteristics.

The ceramic adhesive 17 cures with vaporization of a solvent, and depending on volume reduction of the solvent due to the vaporization, the volume of the ceramic adhesive 17 reduces (contraction due to cure).

The contraction factor directly relates to sandwiching force between the right-angle PBSs of the third and fourth optical parts of the integrated optical voltage sensor. Therefore, in the case where the contraction factor is too large, the friction which fixes the multilayer film zero-order λ/4 plate 2 and the Pockels element 3 increases. On the other hand, the stress applied to the multilayer film zero-order λ/4 plate 2 and the Pockels element 3 also increases, and degradation of characteristics is caused. To the contrary, in the case where the contraction factor is too small, the stress applied to the multilayer film zero-order λ/4 plate 2 and the Pockels element 3 decreases. However the friction which fixes the multilayer film zero-order λ/4 plate 2 and the Pockels element 3 decreases, and the optical axis becomes misaligned due to an impact or the like, causing degradation of characteristics. Since the vaporization state of the solvent which decides the contraction factor depends on cure conditions such as the air pressure, temperature, and time in curing of the ceramic, an optical voltage sensor having optimum characteristics can be obtained by properly controlling the cure conditions.

As the Pockels element 3, the same as in the prior art, are used $Bi_{12}SiO_{20}$(BSO), KDP, $LiNbO_3$ and $LiTaO_3$ having birefringence property, and the like. To the Pockels element 3 are electrically connected the electrode terminal 14 for applying a voltage, the lead wire 13 and the electrode 5 so as to apply the object voltage 24 to the electrode terminal 14.

As the λ/4 plate can be used any other materials than the multilayer zero-order λ/4 plate, if the material has identical characteristics. The axial displacement angle can be reduced to 0.2° or less by making the optical parts so as to have a plane-making accuracy of 30 minutes or less, and thereby temperature dependence due to the axial displacement is controlled. Additionally as a material of the holder 10 is preferable an inorganic material whose deformation due to changes in temperature is small, for example, a ceramic material is the best in characteristics, however, in consideration of the cost, metal material may be also used if a low degree of degradation thereof is not problematic.

Next, FIG. 6 is a diagram showing temperature dependences of the sensitivity of an optical voltage sensor of the first embodiment, and shows good characteristics of ±1% or less over a range of 20° to 80° C.

The embodiment is explained giving an optical voltage sensor of a high modulation type of light quantity as an example, however, the invention can be also applied to an optical voltage sensor of a light quantity phase modulation type (see Japanese Unexamined Patent Publication JP-A 5-222515, JP-A 6-190281). That is, that application is made possible by replacing the multilayer film zero-order λ/4 plate 2 as the first optical part 25 by a Pockels element 41 for modulation.

The above description relates to a case where optical parts whose optical characteristic is changed by stress, however, the invention can be applied to a piezoelectric element in which other physical characteristics are changed by stress.

The number of optical parts which are sandwiched and fixed is not restricted to two, and one, three, or more is possible.

The invention can be also applied to a group of optical parts other than an optical voltage sensor.

According to the invention, as apparent from the above description, in the case of an optical voltage sensor, the λ/4 plate and the Pockels s element are free from stress. Therefore, an object voltage can be accurately measured without being affected by temperature, and the temperature dependence can be easily controlled, thus achieving cost reduction.

What is claimed is:

1. An optical device, comprising:
  a first end optical part defining an optical axis;
  a second end optical part positioned along the optical axis, the first end optical part and the second end optical part being bound together; and
  at least one intermediate optical part positioned along the optical axis and sandwiched between the first end optical part and the second end optical part such that the position of the at least one intermediate optical part is fixed relative to the first and second end optical parts by, at least in part, friction without bonding thereof.

2. An optical device as recited in claim 1, wherein
  there are a plurality of intermediate optical parts, and
  each of the intermediate optical parts are fixed in position without bonding by, at least in part, friction generated from another of the intermediate optical parts and either still another of the intermediate optical parts or one of the first and second end optical parts.

3. An optical device as recited in claim 2, wherein
  the intermediate optical parts include a first intermediate optical part and a second intermediate optical part,
  the first and the second intermediate optical parts having optical characteristics which are changed by stress and being fixed to the first and second end optical parts by, at least in part, friction generated from contact
  between a light outgoing face of the first end optical part and a light incoming face of the first intermediate optical part,
  between a light outgoing face of the first intermediate optical part and a light incoming face of the second intermediate optical part, and
  between a light outgoing face of the second intermedidate optical part and a light incoming face of the second end optical part, such that
  light comes into the first end optical part, passes through the first and the second intermediate optical parts, and exits through the second end optical part.

4. An optical device as recited in claim 3, wherein the first and second end optical parts are each composed of a lens, a holder and a right-angle PBS.

5. An optical device as recited in claim 4, wherein only the holder of the first end optical part and the holder of the second end optical part are bound together.

6. An optical device as recited in claim 3, wherein
  a loop-form elastic body bundles the optical parts together along faces other than the contact faces.

7. An optical device as recited in claim 3, wherein the first intermediate optical part is a λ/4 plate, and the second intermediate optical part is a Pockels element to which object voltage may be applied.

8. An optical device as recited in claim 3, wherein the first intermediate optical part is a Pockels element for modulation, and the second intermediate optical part is a Pockels element to which object voltage may be applied.

9. An optical device as recited in claim 3, wherein the first and second intermediate optical parts are such that whether a physical action is applied to the first or the second optical part and an amount of the physical action applied to the first or second optical part can be determined from a difference between incoming and exiting light.

10. An optical device as recited in claim 1, wherein the first end optical part and the second end optical part are bound together by an adhesive.

11. An optical device as recited in claim 1, wherein the adhesive is an inorganic adhesive.

12. An optical device as recited in claim 11, wherein
  the coefficient of thermal expansion of the inorganic adhesive after curing is $20 \times 10^{-6}$/°C. or less.

13. A method of manufacturing an optical device, comprising:
  arranging a first end optical part, at least one intermediate optical part, and a second end optical part, in order, in a guide for adjusting the optical parts relative to an optical axis;
  binding the first and second end optical parts by cure of an adhesive while applying a force to outsides of the first and second end optical parts in a direction parallel to the optical axis; and releasing the optical parts from the guide.

14. A method of manufacturing an optical device as recited in claim 13, further including:

arranging the optical parts in a case having a partition plate therein which divides the case into two spaces, a first space which contains the at least one intermediate optical part, and a second space which does not contain the at least one intermediate optical part, but which contains the first and second end optical parts; and filling the second space, at least in part, with the adhesive.

15. A method of manufacturing an optical device as recited in claim 3, wherein the adhesive is an inorganic adhesive.

* * * * *